(12) United States Patent
Liu

(10) Patent No.: US 7,589,594 B2
(45) Date of Patent: Sep. 15, 2009

(54) VARIABLE LOOP BANDWIDTH PHASE LOCKED LOOP

(75) Inventor: Chunbo Liu, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 742 days.

(21) Appl. No.: 11/260,442

(22) Filed: Oct. 27, 2005

(65) Prior Publication Data

US 2007/0099581 A1    May 3, 2007

(51) Int. Cl.
*H03L 7/00*    (2006.01)
(52) U.S. Cl. .......................... 331/16; 331/1 A; 331/34; 331/179; 327/156
(58) Field of Classification Search ................. 331/1 A, 331/16, 34, 179; 327/156
See application file for complete search history.

(56) References Cited

U.S. PATENT DOCUMENTS

| | | | |
|---|---|---|---|
| 6,456,165 B1 * | 9/2002 | Kelkar ......................... | 331/17 |
| 6,792,062 B2 * | 9/2004 | Vaucher ...................... | 375/374 |
| 6,864,753 B2 * | 3/2005 | Lee et al. ..................... | 331/17 |
| 6,888,413 B1 * | 5/2005 | Adams et al. ................. | 331/17 |

* cited by examiner

*Primary Examiner*—Arnold Kinkead
(74) *Attorney, Agent, or Firm*—Christopher P. Maiorana, PC

(57) ABSTRACT

An apparatus comprising a voltage controlled oscillator, a first charge pump, a second charge pump, a switch circuit and a comparator circuit. The voltage controlled oscillator may be configured to generate an output signal oscillating at a first frequency in response to a control signal. The charge pump circuit may be configured to generate a first component of the control signal in response to a first adjustment signal and a second adjustment signal. The second charge pump may be configured to generate a second component of the control signal in response to a first intermediate signal and a second intermediate signal. The switch circuit may be configured to generate the first intermediate signal and the second intermediate signal in response to the first adjustment signal and the second adjustment signal. The comparator circuit may be configured to generate the first and second adjustment signals in response to a comparison between (i) an input signal having a second frequency and (ii) the output signal.

20 Claims, 5 Drawing Sheets

VARIABLE LOOP BANDWIDTH PHASE LOCKED LOOP

FIELD OF THE INVENTION

The present invention relates to phase locked loops generally and, more particularly, to a method and/or apparatus for implementing a variable loop bandwidth phase locked loop.

BACKGROUND OF THE INVENTION

Conventional phase locked loops (PLLs) are widely used in frequency synthesis, clock and data recovery, and other communications circuits. Conventional PLLs need to vary the loop bandwidth within the PLL. For example, an input clock is often noisy. If a clean clock is needed at the output of the PLL, a narrow bandwidth filter can be implemented to filter out the input noise. A different situation arises when the lock time is important. In such cases, a wide bandwidth PLL is needed to achieve fast locking. In some systems, a PLL is needed to switch between a narrow bandwidth mode and a wide bandwidth mode.

Referring to FIG. 1, a diagram of a system 10 is shown illustrating a conventional PLL. The system includes a charge pump 12, a phase frequency detector 14 and a loop filter 16. The charge pump 12 receives signals from the phase frequency detector 14. The loop filter 16 is shown implemented as a second order loop filter that converts the charge pump current ICP into a control voltage. The loop bandwidth of the PLL may be approximated by the following equation:

$$\overline{\omega}_u = \frac{ICPR_z K_{vco}}{2\pi N} \quad \text{EQ. (1)}$$

where ICP is the charge pump current, $R_z$ is the loop filter resistor, $K_{VCO}$ is the VCO gain, and N is the feedback frequency divider ratio. A stabilizing zero is formed by the resistor $R_z$ and the capacitor $C_z$, with the frequency defined as $\overline{\omega}_z = 1/(R_z C_z)$. The loop filter 16 has two poles, a first pole at w=0 and a second pole at $\overline{\omega}_p = 1/(R_z C_1)$.

To maintain stability, the loop may be designed to have a damping factor close to 1. The damping factor is given by the following equation:

$$\xi = \sqrt{\frac{ICPK_{vco}}{2\pi N(C_1 + C_z)}} \left(\frac{1}{2} R_z C_z\right) \quad \text{EQ. (2)}$$

The second pole $\overline{\omega}_p$ is chosen 3-10 times higher than $\overline{\omega}_u$. In a scheme aimed at varying the loop bandwidth $\overline{\omega}_u$, a guarantee that stability is not sacrificed is important.

It would be desirable to implement a variable loop bandwidth phase locked loop circuit that may accommodate a variety of applications.

SUMMARY OF THE INVENTION

The present invention concerns an apparatus comprising a voltage controlled oscillator, a first charge pump, a second charge pump, a switch circuit and a comparator circuit. The voltage controlled oscillator may be configured to generate an output signal oscillating at a first frequency in response to a control signal. The charge pump circuit may be configured to generate a first component of the control signal in response to a first adjustment signal and a second adjustment signal. The second charge pump may be configured to generate a second component of the control signal in response to a first intermediate signal and a second intermediate signal. The switch circuit may be configured to generate the first intermediate signal and the second intermediate signal in response to the first adjustment signal and the second adjustment signal. The comparator circuit may be configured to generate the first and second adjustment signals in response to a comparison between (i) an input signal having a second frequency and (ii) the output signal.

The objects, features and advantages of the present invention include providing a phase locked loop that may (i) provide a variable loop bandwidth, (ii) increase or decrease the bandwidth while maintaining stability, and/or (iii) be easy to implement while providing loop stability.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
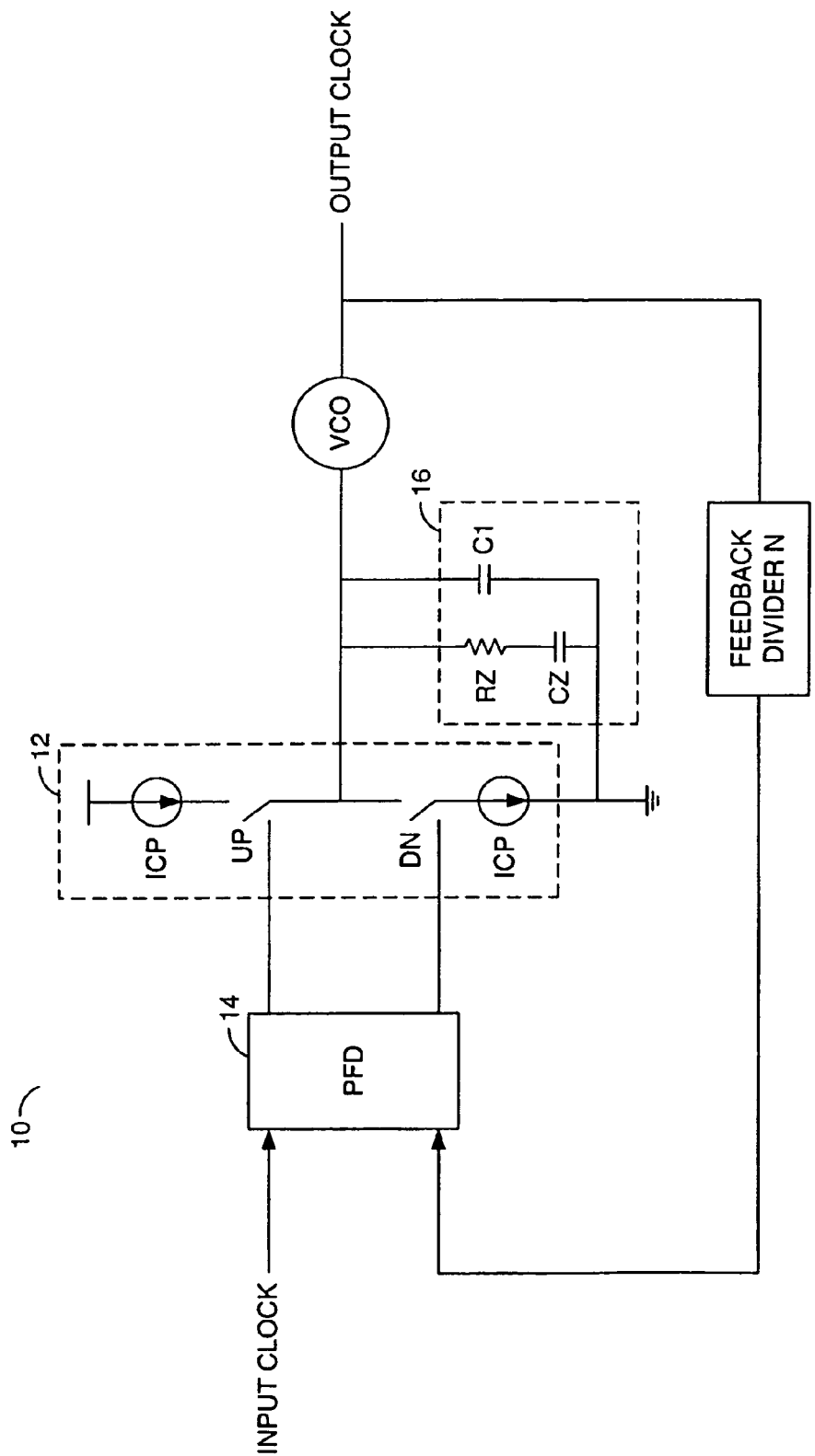
FIG. 1 is a diagram illustrating a conventional PLL.
Figure 2:
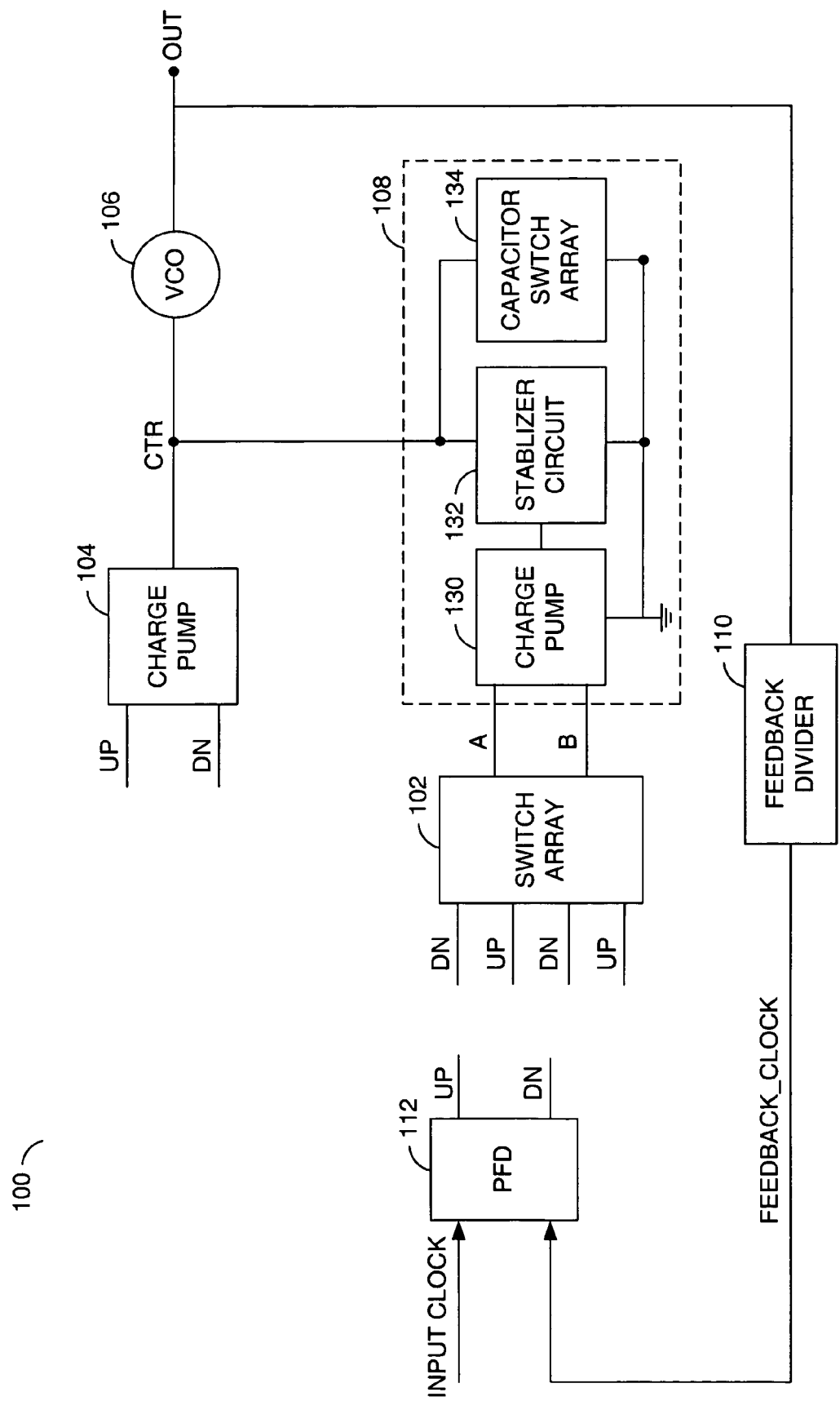
FIG. 2 is a block diagram illustrating an embodiment of the present invention.

Referring to FIG. 2, a block diagram of a system 100 in accordance with a preferred embodiment of the present invention is shown. The system 100 may be implemented as a variable loop bandwidth phase locked loop. The system 100 generally comprises a block (or circuit) 102, a block (or circuit) 104, a block (or circuit) 106, a block (or circuit) 108, a block (or circuit) 110 and a block (or circuit) 112. The circuit 102 may be implemented as a switching array. The circuit 104 may be implemented as a charge pump circuit. The circuit 106 may be implemented as a voltage controlled oscillator. The circuit 108 may be implemented as a control circuit. The circuit 110 may be implemented as a feedback divider. The circuit 112 may be implemented as a phase frequency detector (or comparator circuit). The switch array 102 may receive a signal (e.g., UP) and a signal (e.g., DN) that may be generated by the phase frequency detector 112. The charge pump 104 may also receive the signal UP and the signal DN. The switch array 102 generally presents a signal (e.g., A) and a signal (e.g., B) to the circuit 108. The signal UP and the signal DN may be adjustment signals.

Various combinations of the signal UP and the signal DN may be presented to the switch array 102. In the example shown, the switch array 102 receives two versions of the signal DN and two versions of the signal UP, shown in a generally sequential order presented to the switch array 102 (e.g., DN, DN, UP, UP). However, other orders may be implemented to meet the design criteria of a particular implementation. Additionally, more than two versions of the signal DN and the signal UP may be implemented in certain design applications.

The charge pump circuit 104 may present a first component of a signal (e.g., CTR) to the voltage controlled oscillator 106. The signal CTR may be a control signal configured to control a frequency of oscillation of a signal (e.g., OUT) presented by the voltage control oscillator 106. The control circuit 108 may present a second component of the control signal CTR. For example, the charge pump 104 and the control circuit 108 each contribute to the signal CTR. The charge pump 104 and the control circuit 108 both contribute to the frequency of oscillation of the signal OUT by contributing to the signal CTR. The feedback divider 110 may be used to divide the frequency of the signal OUT before being presented to the phase frequency detector 112. The divided version of the signal OUT is shown as a signal (e.g., FEEDBACK_CLOCK) presented to the phase frequency detector 112. The particular amount of division provided by the circuit 112 may be varied to meet the design criteria of a particular implementation. In certain implementations, a divide by one may be implemented, which leaves the frequency of the signal FEEDBACK_CLOCK unchanged from the frequency of the signal OUT. In other implementations, various divide factors may be implemented.

The control circuit 108 generally comprises a block (or circuit) 130, a block (or circuit) 132, and a block (or circuit) 134. The circuit 130 may be implemented as a charge pump. The circuit 132 may be implemented as a stabilizer circuit. The circuit 134 may be implemented as a capacitor switch array. The charge pump 130 is shown contributing to the signal CTR through the stabilizer circuit 132. However, in certain implementations, the charge pump 130 may directly contribute to the signal CTR (e.g., through a connection that does not pass through the stabilizer circuit 132). In such an implementation, the stabilizer circuit 132 may need to be connected to the charge pump 104.

Figure 3:
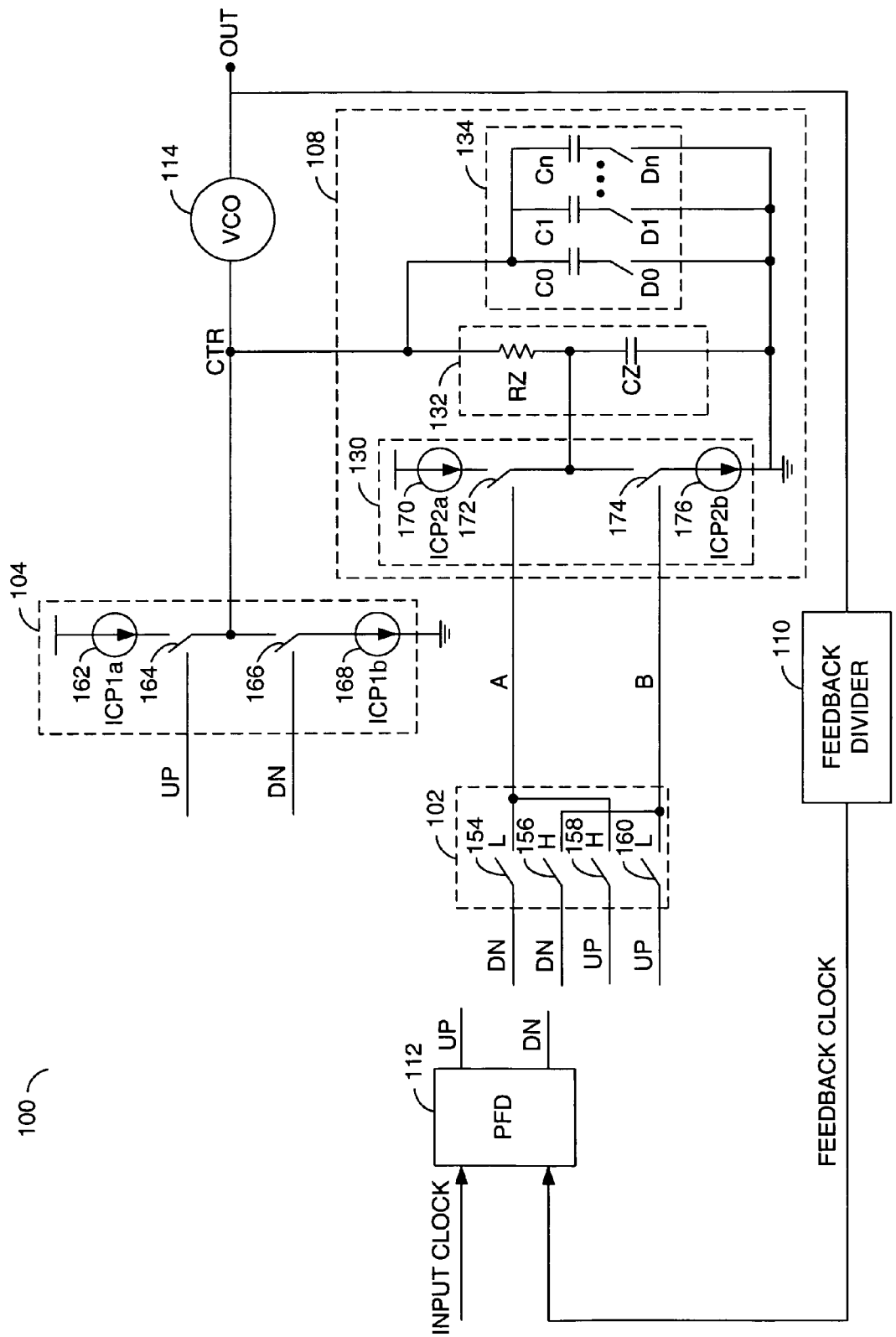
FIG. 3 is a detailed diagram illustrating an embodiment of the present invention.

Referring to FIG. 3, a more detailed block diagram of a system 100 is shown. In general, the system 100 may be used to vary the loop bandwidth of the system 100 while maintaining loop stability. The bandwidth of the system 100 may be varied in response to one or more control signals (e.g., L and H). The signal L may be used to lower the loop bandwidth. For example, if the signal L is high (or true) the bandwidth of the system 100 may be reduced. Similarly, if the signal H is high (or true) the bandwidth of the system 100 may be increased. The control signals L and H may be used to control the charge pump 130. In general, the charge pump 130 either adds or subtracts from the effect of the charge pump 104, in response to the control signals L and H.

The switch array 102 generally comprises a switch 154, a switch 156, a switch 158, and a switch 160. The particular number of switches in the switch array 102 may be varied to meet the design criteria of a particular implementation. The charge pump circuit 104 generally comprises current source 162, a switch 164, a switch 166 and a current source 168. A connection between the switch 164 and the switch 166 may be connected to the voltage controlled oscillator 114. The charge pump 104 uses a current ICP1a and a current ICP1b to generate a portion of the signal CTR. In general, the current ICP1a and the current ICP1b are equal. However, due to process and/or design variations, the current ICP1a and the current ICP1b may not always be equal.

The charge pump circuit 130 generally comprises a current source 170, a switch 172, a switch 174, and a current source 176. The stabilizer circuit 132 generally comprises a resistor RZ and a capacitor CZ. The capacitor switch array 134 generally comprises a number of capacitors C0-Cn and a number of switches D0-Dn. The particular number of capacitors Ca-Cn and the particular number of switches D0-Dn may be varied to meet the design criteria of a particular implementation. In general, each of the capacitors C0-Cn has a similar capacitance. However, due to process variations, the particular capacitances of the capacitors C0-Cn may vary.

In general, the switches 154 and 160 receive the signal L. The switches 156 and 158 may receive the signal H. In one example, the control signals L and H may be generated internally within the system 100. In another example, the control signals L and H may be generated externally to the system 100. In one example, the control signals L and H may be generated by a circuit. In another example, the control signals L and H may be received as user inputs. In general, the switches 154-160 may be turned on or off to control the bandwidth of the system 100. The current source 162 may generate the current ICP1a in response to activating the switch 164. The switch 164 may be activated when the signal L presented to the switch 150 is high (or true). The current source 168 may generate the current ICP1b in response to activating the switch 166. The switch 166 may be activated when the signal L presented to the switch 152 is high (or true). The following table illustrates examples of the various signals:

TABLE 1

| Signal | H = high, L = low | H = low, L = high |
|---|---|---|
| A | Up | Dn |
| B | Dn | Up |

The current source 170 and the current source 176 may generate the second component of the control signal CTR. The current source 170 may generate the signal ICP2a in response to activating the switch 172. The switch 172 may be activated when the (i) signal L presented to the switch 154 is low or (ii) the signal H presented to the switch 158 is high. The current source 176 may generate the current ICP2b in response to activating the switch 174. The switch 174 may be activated when the (i) signal H presented to the switch 156 is low or (ii) signal L presented to the switch 160 is high. In general, the current ICP2a and the current ICP2b are equal. However, due to process and/or design variations, the current ICP2a and the current ICP2b may not always be equal.

The system 100 may adjust the bandwidth while maintaining a generally consistent damping factor. The currents ICP1a, ICP1b, ICP2a and ICP2b control the damping factor. The signals UP and DN presented to the charge pump 104 and the switch array 122 may be implemented (i) in opposite polarities (e.g., UP/DN versus DN/UP) or (ii) with the same polarity (e.g., UP/DN versus UP/DN). The reversal of the second charge pump 130 (which reduces the loop bandwidth) is normally controlled by the control signals H and L for the switch 154, the switch 156, the switch 158 and the switch 160. The signals UP and DN presented to the charge pump circuit 104 and the switch array circuit 102 may have similar polarities. The loop bandwidth may be shown by the following equation:

$$\varpi'_u = \frac{I_t R_z K_{vco}}{2\pi N} = \alpha \varpi_u \qquad \text{EQ. (3)}$$

The current $I_t$ may be shown by the following equation:

$$I_t = ICP1 \pm ICP2 \qquad \text{EQ. (4)}$$

The zero formed by the stabilizer circuit 132 may be defined as $\overline{\omega}_z' = \overline{\omega}_z \alpha$. The parameter $\alpha$ may be determined by the ratio of the signal ICP2 and the signal ICP1. The parameter $\alpha$ may be given by the following equation:

$$\alpha = 1 \pm ICP2/ICP1 \qquad \text{EQ. (5)}$$

The sign in EQ. 4 and EQ. 5 may be determined as follows:
 (i) if the signal L is set to low and the signal H is set to high, then $\alpha = 1 + ICP2/ICP1$ and $I_t = ICP1 + ICP2$; or
 (ii) if the signal L is set to high, then a $\alpha = 1 - ICP2/ICP1$ and $I_t = ICP1 - ICP2$.

The damping factor may be shown by the following equation:

$$\xi' = \xi \sqrt{\frac{I_t}{I_{t0}}} \frac{1}{\alpha} \qquad \text{EQ. (6)}$$

where $I_{t0}$ may be the initial value of the current $I_t$.

The bandwidth may be varied by changing the current $I_t$. For example, if $I_{t0} = ICP1$ or $\alpha = 1$, and a decrease in the bandwidth is needed, the signal H may be set to low and the signal L may be set to high. The bandwidth of the system 100 may be decreased when the difference between the current ICP1 and the current ICP2 (e.g., $I_t$), is decreased. If an increase to the bandwidth is needed, the signal H may be set to high and the signal L may be set to low. The bandwidth may be increased when the sum ($I_t$) of the current ICP1 and the current ICP2 is increased.

Stability in the system 100 may be maintained provided the current ICP1 and the current ICP2 meet the following conditions:

$$\alpha = \frac{I_t}{ICP1} \qquad \text{EQ. (7)}$$

Following EQ. (6), to maintain a constant damping factor $$\alpha^2 = \frac{I_t}{I_{t0}} \qquad \text{EQ. (8)}$$

By solving for the current ICP1 and the current ICP2 from EQS. (7) and (8), the following equations may be produced:

$$ICP1 = \alpha I_{t0}$$

$$ICP2 = \pm(\alpha - \alpha^2) I_{t0} \qquad \text{EQ. (9)}$$

Given $I_{t0}$ and $\alpha$ (e.g., the bandwidth multiplying factor), the signal ICP1 and the signal ICP2 may be uniquely determined from EQ. (9).

The +/− notation in EQ9 indicates two conditions. A first condition (e.g., the + condition) occurs when the signal L is high (or true). A second condition (e.g., the − condition) occurs when the signal H is high (or true).

The pole formed by the system 100 may be defined by the following equation:

$$\overline{\omega}_p' = 1/(RC_{eq}) \qquad \text{EQ. (10)}$$

-continued $$C_{eq} = C_0 \sum_{i=1,N} D_i$$

$C_{eq}$ may be an effective capacitance and equal to $\alpha C1$ by selecting the capacitor C0 and activating the number of switches D0-Dn. By selecting one or more of the capacitors C0-Cn by selecting the corresponding switches D0-Dn, the system 100 ensures that a second pole does not impact the phase margin when the bandwidth is varied. In general, since each of the capacitors C0-Cn are similar, the above equation is valid for the particular capacitance selected.

Figure 4:
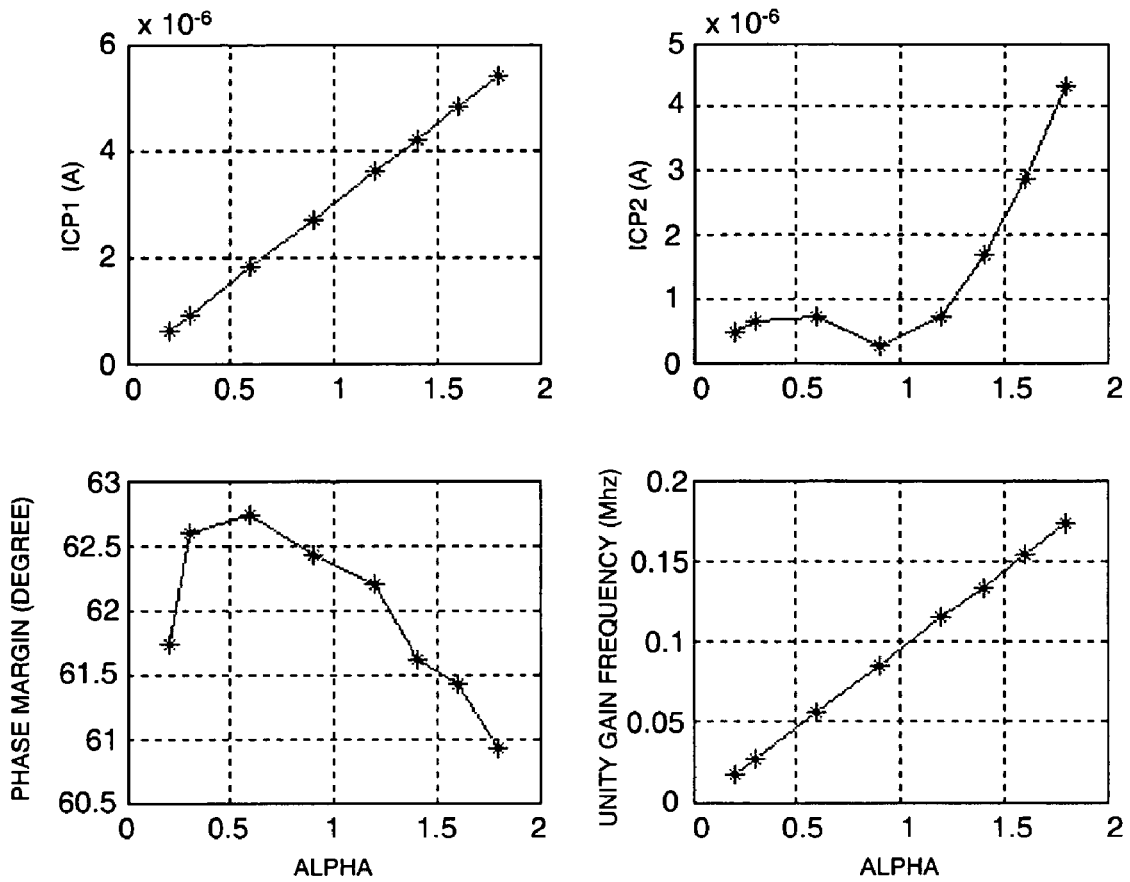
FIG. 4 is a diagram illustrating a simulated bandwidth and phase margin versus alpha.

Referring to FIG. 4, a diagram illustrating a simulated bandwidth and phase margin versus alpha is shown. In FIG. 4 the simulated loop bandwidth of the PLL is plotted versus $\alpha$. While the bandwidth is varied by an order of magnitude, the phase margin is almost flat which indicates that the stability of the system 100 is maintained.

The system 100 may also function when the loop bandwidth is needed to remain constant while the feedback divider ratio generated from the feedback divider 110 is varied. In such a case, one can choose a $\alpha = N'/N$, where N' may be defined as the varied divider ratio. The currents ICP1 and ICP2 may be determined by EQ. (9). In one example, the switches D0-Dn may be omitted and a single capacitor C1 may be implemented if the desired bandwidth change is small (e.g., around two times) to ensure that $\overline{\omega}_p$ is adequately separated from $\overline{\omega}_u'$.

Figure 5:
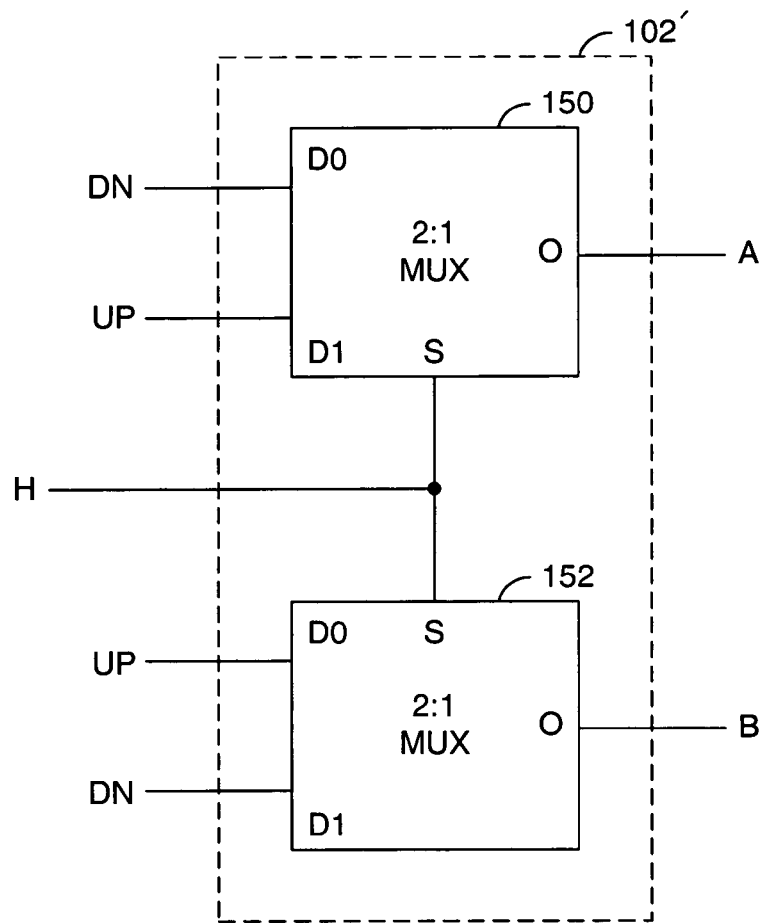
FIG. 5 is a diagram illustrating an alternate implementation of the switch array.

Referring to FIG. 5, an alternate implementation of the switch array is shown implemented as a switch array 102'. The switch array 102' generally comprises a multiplexer 150 and a multiplexer 152. In one example, the multiplexer 150 and the multiplexer 152 may be implemented as 2:1 multiplexers. The multiplexer 150 is shown having an input (e.g., D0) that may receive the signal DN and an input (e.g., D1) that may receive the signal UP. A select input (e.g., S) may receive the signal H. The multiplexer 150 may have an output (e.g., L) that may present the signal A in response to the signal DN, the signal UP and the signal S. The multiplexer 152 may have a similar implementation. For example, the multiplexer 152 may have an input D0 that may receive the signal UP, an input D1 that may receive the signal DN, an input S that may receive the signal H and an output L that may present the signal B. In the example shown, the input D0 of the multiplexer 150 may receive the signal DN, while the input D0 of the multiplexer 152 may receive the signal UP. Similarly, the input D1 of the multiplexer 150 may receive the signal UP, while the input D1 of the multiplexer 152 may receive the signal DN. By alternating the D0 and D1 inputs between the multiplexer 150 and the multiplexer 152, a single signal H may be used to generate the signals A and B. While specific examples of the switch array 102 and the switch array 102' have been shown, other examples may be implemented to meet the design criteria of a particular implementation.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a voltage controlled oscillator configured to generate an output signal oscillating at a first frequency in response to a control signal;
   a first charge pump circuit configured to generate a first component of said control signal in response to a first adjustment signal and a second adjustment signal;
   a second charge pump configured to generate a second component of said control signal in response to a first intermediate signal and a second intermediate signal;
   a switch circuit configured to generate said first intermediate signal and said second intermediate signal in response to said first adjustment signal and said second adjustment signal; and
   a comparator circuit configured to generate said first adjustment signal and said second adjustment signal in response to a comparison between (i) an input signal having a second frequency and (ii) said output signal.

2. The apparatus according to claim 1, wherein said first component of said control signal and said second component of said control signal each comprise programmable currents, selected to vary the bandwidth of said apparatus while maintaining stability.

3. The apparatus according to claim 1, wherein said switch circuit is configured to generate said first and second intermediate signals in further response to one or more control inputs.

4. The apparatus according to claim 1, further comprising:
   a divider circuit configured to divide said first frequency of said output signal before said comparator circuit generates said first and second adjustment signals.

5. The apparatus according to claim 1, wherein said second charge pump comprises a control circuit, and said control circuit further comprises:
   a capacitor switch array circuit connected between said first charge pump and said second charge pump; and
   a stabilizer circuit connected in parallel with said capacitor switch array circuit.

6. The apparatus according to claim 5, wherein said capacitor switch array circuit is configured to adjust one or more capacitors in response to a signal received from said switch circuit.

7. The apparatus according to claim 1, wherein said comparator circuit comprises a phase frequency comparator.

8. The apparatus according to claim 1, wherein said switch circuit is configured to generate said first intermediate, second intermediate, third intermediate and fourth intermediate signals in response to a first and second control signal.

9. The apparatus according to claim 1, wherein said apparatus comprises a variable loop bandwidth phase locked loop circuit.

10. The apparatus according to claim 1, wherein said control circuit adjusts the bandwidth of said apparatus in response to said control signals based on whether the sum of said first component of said control signal and said second component of said control signal increases or decreases.

11. The apparatus according to claim 6, wherein said capacitor switch array comprises a plurality of capacitors and a plurality of switches.

12. A method for controlling a loop bandwidth in a phase locked loop, comprising the steps of:
   (A) generating an output signal oscillating at a first frequency in response to a control signal;
   (B) generating a first component of said control signal in response to a first adjustment signal and a second adjustment signal;
   (C) generating a second component of said control signal in response to a first intermediate signal and a second intermediate signal;
   (D) generating said first intermediate signal and said second intermediate signal in response to said first adjustment signal and said second adjustment signal; and
   (E) generating said first adjustment signal and said second adjustment signal in response to a comparison between (i) an input signal having a second frequency and (ii) said output signal.

13. The method according to claim 12, further comprising:
   dividing said first frequency of said output signal before generating said first and second adjustment signals.

14. The method according to claim 12, wherein step (C) comprises:
   a capacitor switch array circuit; and
   a stabilizer circuit.

15. The method according to claim 14, further comprising the step of:
   adjusting one or more capacitors in response to a signal received from a switch circuit.

16. The method according to claim 12, wherein said method is implemented in a phase frequency comparator.

17. The method according to claim 13, further comprising the step of:
   generating said first intermediate, second intermediate, third intermediate and fourth intermediate signals in response to a first and second control signal.

18. The method according to claim 12, wherein said method provides a variable control of said loop bandwidth.

19. The method according to claim 13, further comprising the step of:
   adjusting the bandwidth of said phase locked loop in response to said control signals based on whether the sum of said first component of said control signal and said second component of said control signal increases or decreases.

20. An apparatus comprising:
   means for generating an output signal oscillating at a first frequency in response to control signal;
   means for generating a first component of said control signal in response to a first adjustment signal and a second adjustment signal;
   means for generating a second component of said control signal in response to a first intermediate signal and a second intermediate signal;
   means for generating said first intermediate signal and said second intermediate signal in response to said first adjustment signal and said second adjustment signal; and
   means for generating said first adjustment signal and said second adjustment signal in response to a comparison between (i) an input signal having a second frequency and (ii) said output signal.

* * * * *